United States Patent
Park et al.

(10) Patent No.: US 6,584,853 B2
(45) Date of Patent: Jul. 1, 2003

(54) CORROSION-PROOF PRESSURE TRANSDUCER

(75) Inventors: Kyong M. Park, Thousand Oaks, CA (US); Marcos A. Nassar, Los Angeles, CA (US)

(73) Assignee: Kavlico Corporation, Moorpark, CA (US)

( * ) Notice: Subject to any disclaimer, the term of this patent is extended or adjusted under 35 U.S.C. 154(b) by 0 days.

(21) Appl. No.: 09/977,931

(22) Filed: Oct. 12, 2001

(65) Prior Publication Data

US 2003/0070489 A1 Apr. 17, 2003

(51) Int. Cl.[7] .............................................. G01L 9/16
(52) U.S. Cl. ...................................................... 73/754
(58) Field of Search ............................ 73/754, 116, 117, 73/117.2, 117.3, 118.1; 257/254, 257; 361/283; 123/568.16, 676; 60/277, 288; 701/101

(56) References Cited

U.S. PATENT DOCUMENTS 5,578,843 A    11/1996  Garabedian et al.
5,929,498 A    7/1999   Ismail et al.
5,935,189 A    8/1999   Park
6,051,853 A  * 4/2000   Shimada et al. ............ 257/252

OTHER PUBLICATIONS

SCS Parylene Specifications and Properties.

\* cited by examiner

*Primary Examiner*—Hezron Williams
*Assistant Examiner*—Marissa Ferguson
(74) *Attorney, Agent, or Firm*—Oppenheimer Wolff & Donnelly LLP

(57) ABSTRACT

A corrosion proof pressure transducer for measuring exhaust gas pressure includes a chip with a semiconductive diaphragm, electronics, and conductive pads thereon; with leads sonically bonded to the pads. To preclude degradation of the transducer by internal combustion engine exhaust gases, the chip may have (1) a thin glass passivation layer, (2) a vacuum deposited polymeric coating and (3) a layer of gel, thereon.

13 Claims, 3 Drawing Sheets

CORROSION-PROOF PRESSURE TRANSDUCER

FIELD OF THE INVENTION

This invention relates to ultra-reliable pressure sensor assemblies for use under adverse conditions including high vibration and corrosive fluids.

BACKGROUND OF THE INVENTION

As disclosed in U.S. Pat. No. 5,935,189, for example, pressure sensors may be employed to sense the exhaust pressure of internal combustion engines. These exhaust gases contain moisture and highly corrosive gases. It has previously been proposed to use semiconductor pressure sensors with a very thin layer of glass passivation on the surface thereof. In addition, gel has been employed to further protect against corrosion, see U.S. patent application Ser. No. 09/204,326. However, as discussed below, these sensors have been subject to corrosion degradation despite the glass coating, with or without the additional gel.

Incidentally, sensors per se are disclosed in U.S. Pat. Nos. 5,929,498 and 5,578,843, as well as in U.S. patent application Ser. No. 09/704,376, filed Nov. 2, 2000 (Docket 410005-144), all of which are assigned to the assignee of the present invention. The specification and drawings of these prior patents and patent application are hereby incorporated into this application by reference. It is also noted that vacuum deposited polymeric coatings have previously been used to protect electronic semi-conductive chip assemblies.

SUMMARY OF THE INVENTION

In accordance with one aspect of the invention, it has been discovered that, in the adverse environment of automobile exhaust, gases, semi-conductor pressure transducers, even with glass passivation and gel protection, are subject to significant degradation due to the penetration of moisture through the gel, over time. More specifically, when the leads are sonically bonded to the conductive pads on the chips, tiny cracks may be formed which permits entry of corrosive gases and moisture. Also, pin hole openings may be present in thin glass layers.

To overcome this problem it has been determined that additional effective anti-corrosion protection may be obtained through the use of an additional vacuum deposited polymeric coating in addition to a glass layer and gel. Accordingly, a sensitive, reliable, corrosion proof pressure sensor system for the adverse vibration and corrosive intensive environment of internal combustion engines may be realized by the use of a semi-conductive pressure diaphragm and associated electronics mounted on a substrate, with conductive wire bonding pads and sonically welded leads, and with glass passivation over the substrate, an additional gel, and a vapor deposited polymeric coating being provided to insure complete protection of the semi-conductive components and the lead bonding areas. Preferably, the semi-conductive material is protected against oxidation by the thin glass layer, the vacuum formed polymeric layer is deposited, and finally a layer of gel overlies the subassembly.

In accordance with a feature of the invention, a corrosion proof pressure transducer system has a pressure transducer including a chip having a variable capacitor including a diaphragm, preferably a semi-conductive diaphragm, and conductive pads, thereon, together with additional electronic circuitry coupled to the variable capacitor and pads, with the chip having glass passivation thereon, wires sonically bonded to the pads, and a vacuum deposited polymeric coating extending over the chip including the pads, wire connections and leads; and with gel being optionally provided to overly the chip, either before or after the deposition of the polymeric coating.

To summarize, it would normally be expected that the glass passivation layer and a layer of gel would be adequate to preclude corrosion degradation of the pressure sensor. However, it has been determined that, with (1) cracks produced by wire bonding, (2) the vibration present in an automobile exhaust system, together with (3) the very corrosive exhaust gases and moisture, the further protection as outlined above is desirable to provide a long life, reliable and dependable pressure sensor.

Other objects, features and advantages of the invention will become apparent from a consideration of the following detailed description and the accompanying drawings.

DETAILED DESCRIPTION OF THE PREFERRED EMBODIMENTS

Figure 1:
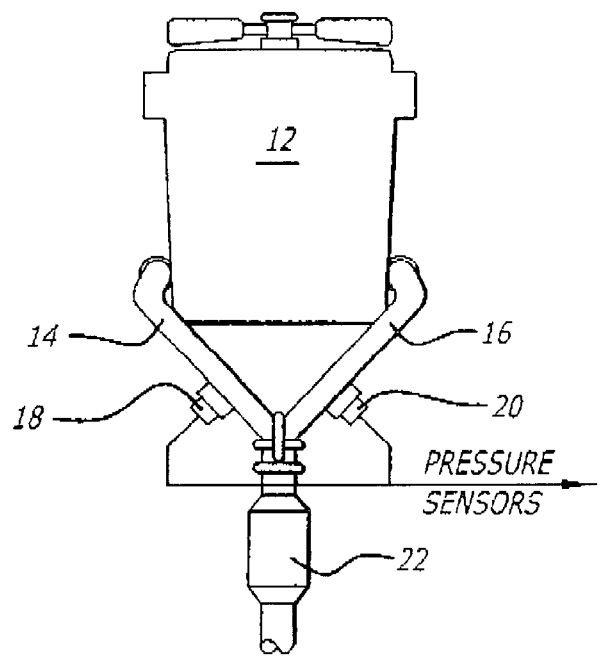
FIG. 1 is a diagrammatic showing of an engine with pressure transducers coupled to the exhaust system of the internal combustion engine.

Referring more particularly to the drawings, FIG. 1 shows an internal combustion engine 12 with dual exhaust pipes 14 and 16, and with capacitive sensors 18 and 20 mounted to sense the pressure in the exhaust pipes 14 and 16. The exhaust pipes 14 and 16 are joined and lead to the catalytic converter 22 on route to the final exhaust from the system which may of course be mounted in an automobile.

Figure 2:
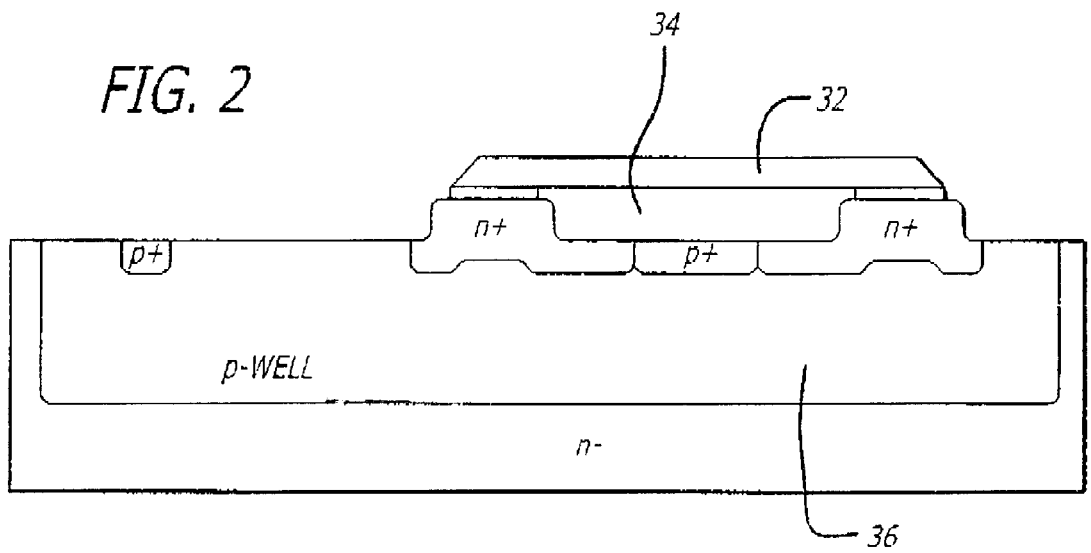
FIG. 2 is a diagrammatic showing of a semi-conductive pressure sensitive diaphragm.

Referring now to FIG. 2 of the drawings, this figure is the same as FIG. 7 of U.S. Pat. No. 5,929,498 granted Jul. 27, 1999, and assigned to the assignee of the present invention. In FIG. 2, the diaphragm 32 has variable pressure applied to it, and in accordance with this variable pressure, it flexes inwardly toward the cavity 34 in the semi-conductive structure 36. The flexing of the diaphragm 32 varies the electrical conditions of the semi-conductive unit shown in FIG. 2 and provides output signals corresponding to the changes in pressure applied to diaphragm 32. For further details of the mode of operation of the assembly of FIG. 2, reference is made to U.S. Pat. No. 5,929,498, as mentioned above.

Figure 3:
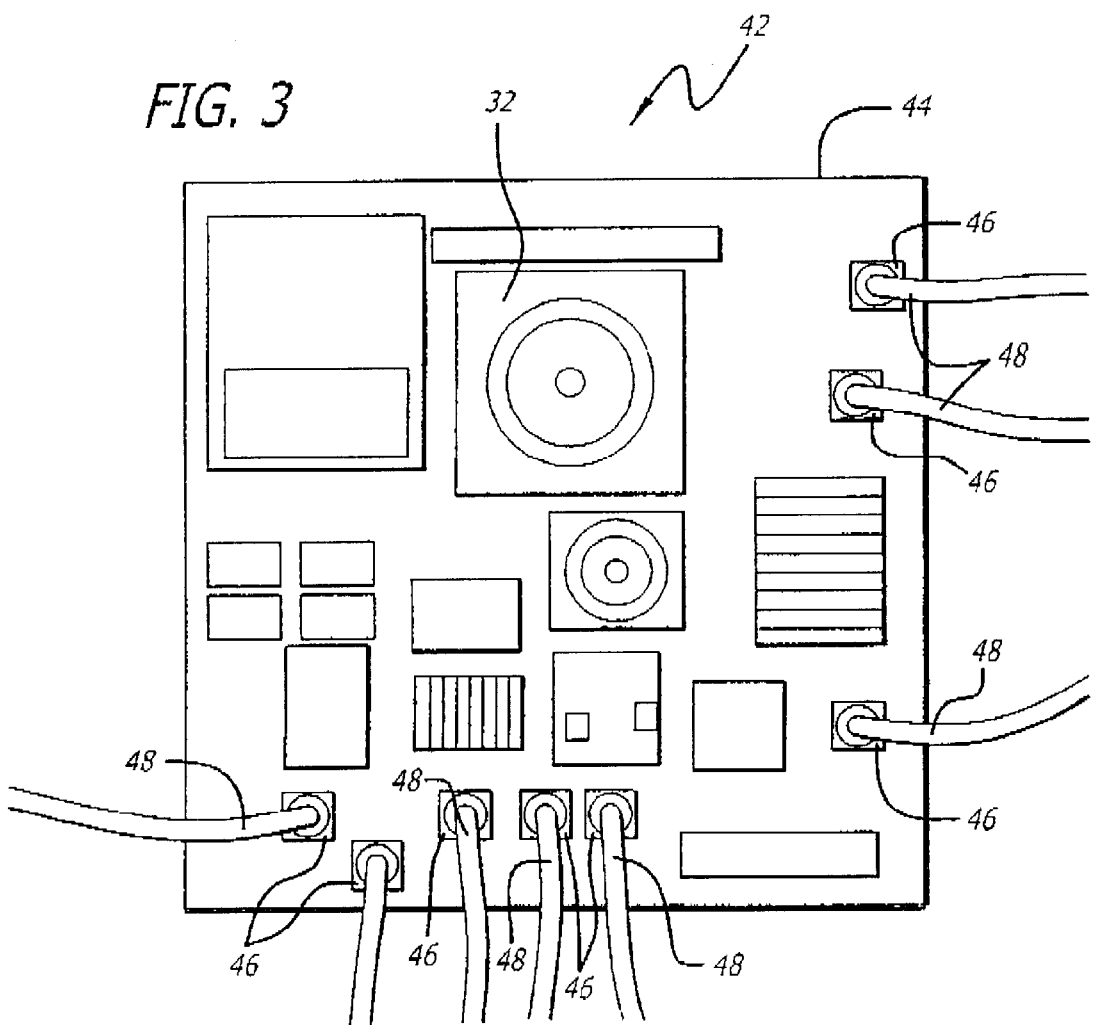
FIG. 3 is a showing of a chip, including a ceramic substrate and semi-conductive components thereon including wires bonded to conductive pads on the chip.

FIG. 3 shows an electronic chip 42 with the diaphragm 32 of FIG. 2 appearing as a circle in this embodiment. The nearby smaller circle 44 is a reference capacitor. A number of additional semi-conductive components are mounted on the chip 42, and the conductive pads 46 are shown with leads 48 sonically bonded thereto. The leads 48 provide power to the electronic components on the chip 42, and also provide the output from the chip with signals corresponding to the changes in pressure applied to the diaphragm 32.

Figure 4:
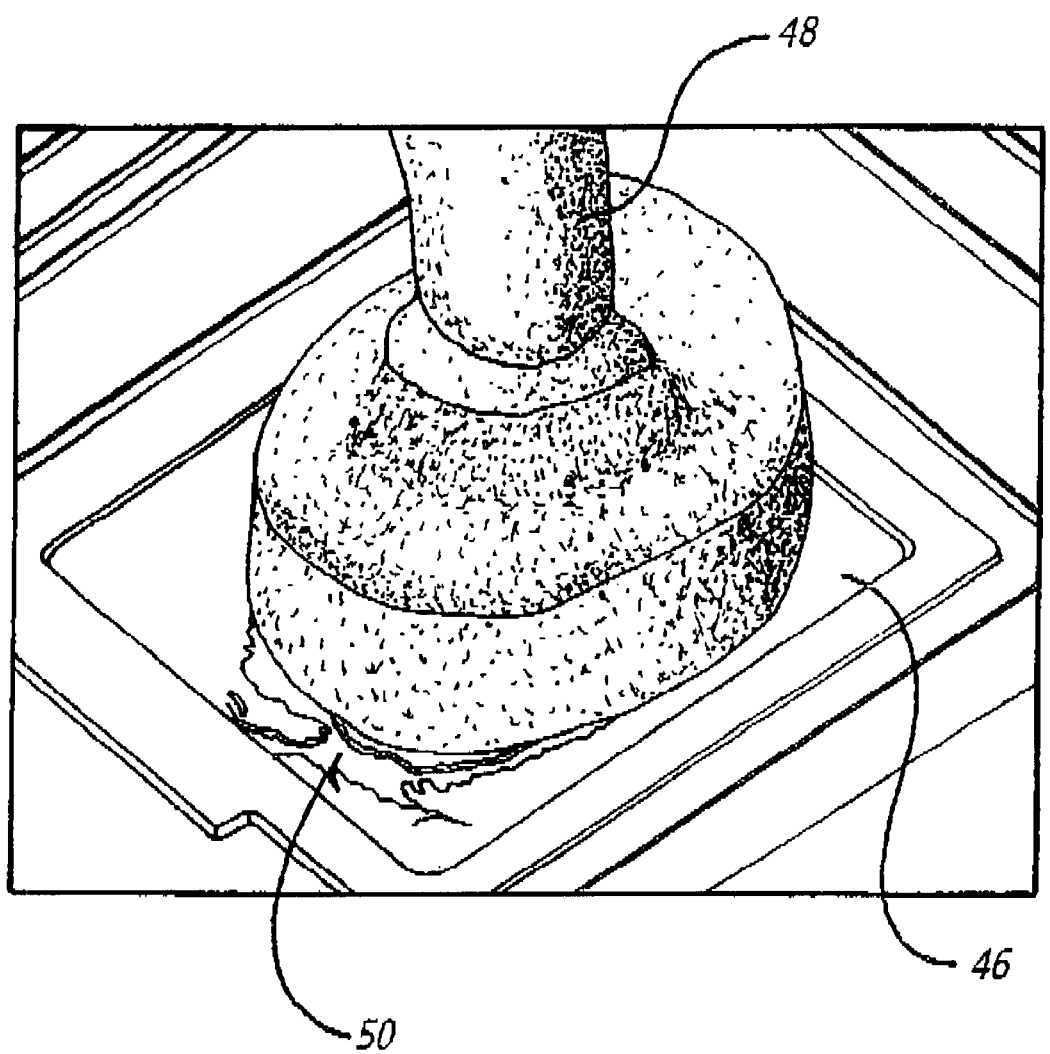
FIG. 4 is an enlarged showing of a lead sonically bonded to a pad on an electronic chip.

FIG. 4 is an enlarged showing of a lead 48 sonically bonded to the conductive pad 46. In the course of sonically bonding the lead 48 to the pad 46, note that the pad 46 is subject to cracks and openings 50 resulting from the sonic bonding step. When the cracks are created, the area becomes vulnerable to chemical damage due to corrosion resulting from noxious gases and associated moisture or water vapor entering the opening 50. Where this is repeated on a number of the pads 46 as shown in FIG. 3, the result may be significant degradation of the function of the pressure sensor over time.

Figure 5:
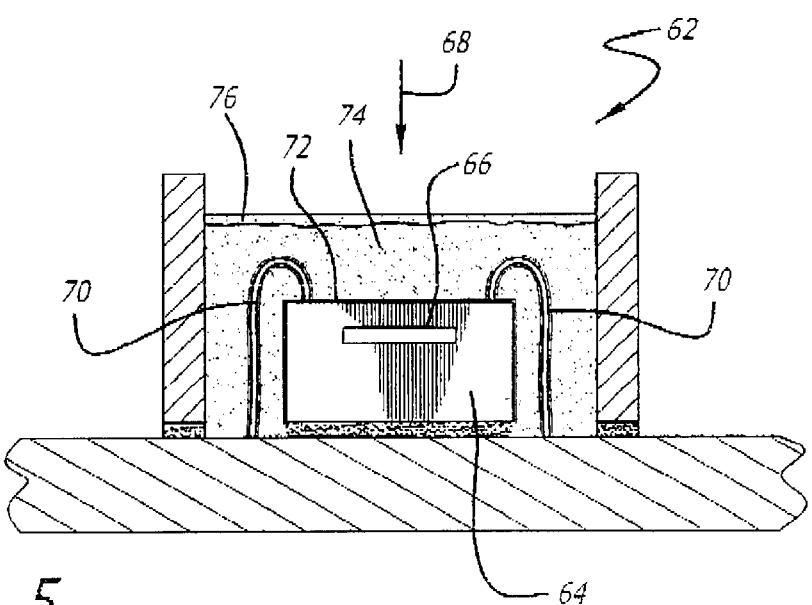
FIG. 5 is a diagrammatic showing of a chip including a semi-conductive diaphragm protected with glass passivation, vacuum deposited polymeric coating and gel.

Referring now to FIG. 5 of the drawings, this is a diagrammatic showing of a pressure sensor assembly 62 including the chip 64 having a diaphragm 66. With pressure being applied as indicated by the arrow 68, the diaphragm 66 will flex, and an indication of the applied pressure will be transmitted over the leads 70, which correspond schematically to the leads 48 as shown in FIG. 3, for example. On the active upper surface of the chip 64 is a very thin glass passivation layer which is so thin as to be essentially represented by the upper line indicating the upper surface or boundary of the chip 64. Following sonic bonding of the leads 70 to the pads on the chip 64, a vacuum formed polymeric coating 72 is applied to the chip 66 and the conductive leads 70. Overlying the upper surface of the chip 64 is a layer of gel 74 which will conduct or transmit applied pressure as indicated by arrow 68 to the diaphragm 66. Overlying the gel layer 74 is shown an optional additional layer 76 of vacuum formed coating of a polymeric dielectric material.

In the assembly of FIG. 5 two vacuum deposited polymeric dielectric coating layers 72 and 76 may be provided, or only one of them may be employed. This vacuum deposited polymeric dielectric coating may be a product known as Parylene™ available from Speedline Coating Systems, 4435 East Airport Drive, Suite 100, Ontario, Calif., 91761-8157.

In conclusion, in the foregoing detailed description and in the accompanying drawings, preferred embodiments of the invention have been disclosed. Various changes and modifications may be made without departing from the spirit and scope of the invention. Thus, by way of example and not of limitations, the vacuum deposited coating may be applied only as indicated reference numerals 72 and on the leads 70 and the additional coating 76 may be omitted. Alternatively, the vacuum deposited coating 72 may be omitted and the coating 76 may be applied, or both coatings may be employed. In addition, other coatings which form thin integral coatings may be employed instead of the specific vacuum formed coating identified hereinabove. Further, instead of the specific capacitive semi-conductive diaphragm assembly as shown in FIG. 2 of the drawings, other pressure sensors using flexible diaphragms may be employed. Accordingly, the present invention is not limited to the precise embodiments described in detail hereinabove and shown in the drawings.

What is claimed is:

1. A corrosion proof pressure transducer system comprising:

an automobile having an exhaust system;

a pressure transducer mounted to sense the pressure in said exhaust system;

said pressure transducer including a chip having a semi-conductive diaphragm and conductive pads thereon;

electrical circuitry mounted on said chip coupled to diaphragm, and said conductive pads;

wires sonically bonded to said conductive pads;

said chip having a glass passivation coating thereon; said glass passivation coating being in intimate contact with the upper surface of said chip and the circuitry on said chip;

a vacuum deposited polymeric dielectric coating extending over the glass coated chip including the conductive pads; and sealing the upper surface thereof; and a layer of gel material overlying said chip;

whereby possible pin holes in the glass coating or cracks in the conductive pads are sealed against the corrosive exhaust gases of said exhaust system.

2. A system as defined in claim 1 wherein said gel material extends over said chip and said polymeric coating.

3. A system as defined in claim 1 wherein another vacuum formed polymeric coating overlies said layer of gel material.

4. A corrosion proof pressure transducer system comprising:

an automobile having an exhaust system;

a pressure transducer mounted to sense the pressure in said exhaust system;

said pressure transducer including a chip having a semi-conductive diaphragm and conductive pads thereon;

wires sonically bonded to said conductive pads;

said chip having a glass passivation coating thereon; said glass passivation coating being in intimate contact with the upper surface of said chip and the circuitry on said chip; and a sealing dielectric coating extending over the glass coated chip including the conductive pads; and sealing the upper surface thereof;

whereby possible pin holes in the glass coating or cracks in the conductive pads are sealed against the corrosive exhaust gases of said exhaust system.

5. A system as defined in claim 4 further comprising gel material extending over said chip.

6. A system as defined in claim 4 further comprising electronic components mounted on said chip.

7. A corrosion proof pressure transducer system comprising:

a pressure transducer including a chip having a semiconductive diaphragm and conductive pads thereon;

gel material extending over said chip;

wires sonically bonded to said conductive pads;

said chip having a glass passivation coating thereon; said glass passivation coating being in intimate contact with the upper surface of said chip and the circuitry on said chip;

a vacuum deposited polymeric dielectric coating extending over the glass coated chip including the conductive pads; and sealing the upper surface thereof;

whereby possible pin holes in the glass coating or cracks in the conductive pads are sealed against adverse environmental conditions.

8. A corrosion proof pressure transducer system comprising:

said pressure transducer including a chip having a flexible diaphragm and conductive pads thereon;

electrical circuitry mounted on said chip coupled to diaphragm and said conductive pads;

wires bonded to said conductive pads;

a sealing polymeric dielectric coating extending over the chip including the conductive pads; and sealing the upper surface thereof; and an additional protective layer overlying said chip;

whereby said chip is sealed against adverse environmental conditions.

9. A system as defined in claim 8 wherein gel material extends over said chip and said polymeric coating.

10. A system as defined in claim 8 wherein a vacuum formed polymeric coating overlies said layer of gel material.

11. A system as defined in claim 8 wherein said chip is coated with a very thin glass passivation coating; said glass passivation coating being in intimate contact with the upper surface of said chip and the circuitry on said chip.

12. A system as defined in claim 8 wherein said system includes a layer of gel overlying said chip.

13. A system as defined in claim 8 wherein said diaphragm is formed of semiconductive material.

* * * * *